US006728322B1

United States Patent
Asai et al.

(10) Patent No.: US 6,728,322 B1
(45) Date of Patent: Apr. 27, 2004

(54) SEQUENTIAL DECODER, AND RECEIVER USING SEQUENTIAL DECODER

(75) Inventors: Takahiro Asai, Yokohama (JP); Tadashi Matsumoto, Yokosuka (JP)

(73) Assignee: NTT Mobile Communications Network, Inc., Tokyo (JP)

( * ) Notice: Subject to any disclaimer, the term of this patent is extended or adjusted under 35 U.S.C. 154(b) by 0 days.

(21) Appl. No.: 09/463,409

(22) PCT Filed: Jun. 1, 1999

(86) PCT No.: PCT/JP99/02917

§ 371 (c)(1),
(2), (4) Date: Feb. 2, 2000

(87) PCT Pub. No.: WO99/63673

PCT Pub. Date: Dec. 9, 1999

(30) Foreign Application Priority Data

Jun. 2, 1998 (JP) ............................................. 10-153244
Jun. 2, 1998 (JP) ............................................. 10-153245

(51) Int. Cl.[7] .............................. H03D 1/00; H04L 27/06

(52) U.S. Cl. ........................................ 375/340; 714/791

(58) Field of Search ................................ 375/340, 341, 375/345; 714/791

(56) References Cited

U.S. PATENT DOCUMENTS 4,710,746 A * 12/1987 Shimoda et al. ............... 341/51
5,710,785 A * 1/1998 Yagi ............................ 714/789

FOREIGN PATENT DOCUMENTS

JP 8-37479 2/1996

OTHER PUBLICATIONS

G. Zimmermann, et al., European Transactions on Telecommunications and Related Technologies, vol. 5, No. 3, pp. 65–365 to 70–370, XP–000456627, "Application of a Simplified Fano Metric to Adaptive Receivers for Digital Mobile Radio Systems", May/Jun. 1994.

E. M. Long, et al., IEEE Transactions on Information Theory, pp. 841–845, XP–010081185, "Decision–Aided Sequential Intersymbol Interference Sequence Estimation for Channels", 1989.

F. R. Magee, Jr., et al., IEEE Transactions on Information Theory, vol. IT–19, No. 1, pp. 120–124, XP–000760840, "Adaptive Maximum–Likelihood Sequence Estimation For Digital Signaling in the Presence of Intersymbol Interference", Jan. 1973.

K. Fukawa, et al., The Transactions of the Institute of Electronics, Information and Communications Engineers, vol. J76–B–II, No. 4, pps. 202–214, "Recursive Least Squares Adaptive Maximum Likelihood Sequence Estimation (RLS–MLSE)—An Application of Maximum Likelihood Estimation Theory to Mobile Radio," Apr. 1993.

T. Matsumoto, Proceedings of the 1997 Communcations Society Conference of IEICE, vol. B–5–149, p. 402, "Sequential Sequence Estimation and Equalization in High Speed Mobile Communcations," Sep. 3–6, 1997.

(List continued on next page.)

Primary Examiner—Mohammad H. Ghayour
Assistant Examiner—Demetria Williams
(74) Attorney, Agent, or Firm—Oblon, Spivak, McClelland, Maier & Neustadt, P.C.

(57) ABSTRACT

A sequential decoder for use in broadband mobile communications and a receiver including the sequential decoder. The sequential decoder computes likelihood values by referring to histories of paths to reduce the required computational effort. The paths include signal points having small tap coefficient values in an equalizer with a transversal filter, and may also include paths within a constraint length which are old in time.

9 Claims, 9 Drawing Sheets

OTHER PUBLICATIONS

F. Jelinek, IBM Journal and Development, vol. 13, No. 5, pps. 675–685, "Fast Sequential Decoding Algorithm Using a Stack," Nov. 1969.

E. Katz, et al., IEEE, Transactions Communications, vol. 43, No. 12, pps. 2882–2885, "Sequential Sequence Estimation for Trellis–Coded Modulation on Multipath Fading ISI Channels," Dec. 1995.

F. Xiong, et al., IEEE Transactions Communications, vol. 38, No. 6, pps. 795–804, "Sequential Sequence Estimation for Channels with Intersymbol Interference of Finite or Infinite Length," Jun. 1990.

F. Jelinek, IBM Journal and Development, vol. 13, No. 6, pps. 675–685, "Fast Sequential Decoding Algorithm Using a Stack," Nov. 1969.

* cited by examiner

SEQUENTIAL DECODER, AND RECEIVER USING SEQUENTIAL DECODER

TECHNICAL FIELD

The present invention relates to a sequential decoder and a receiver using a sequential decoder, and more particularly to a sequential decoder which can be applied to broadband mobile communications and reduces the computational efforts of a sequence estimation, and a receiver equipped with the same.

BACKGROUND ART

There are a block code and a convolutional code as error correction codes. There are Viterbi decoding and sequential decoding as decoding of the convolutional code. The Viterbi decoding is a method of decoding which utilizes a repetition structure of the convolutional code and efficiently performs maximum likelihood decoding. The sequential decoding utilizes a tree structure and approximately performs maximum likelihood decoding with a given memory capacity and a limited number of computations.

However, the Viterbi decoding handles equal-length paths at each time, while the sequential decoding handles a variable-length path. Thus, the sequential decoding does not use a metric used in the Viterbi decoding. For example, although the Hamming distance in a binary symmetric channel takes a metric of the Viterbi decoding, it is not suitable for a case where paths having different lengths are objects to be compared. That is, the Hamming distance of even the maximum likelihood path from a received sequence increases as it becomes longer, and thus the maximum likelihood path has a metric greater than any paths shorter than the same.

Thus, let us consider the following branch metric $\mu(y_t, w_t)$ with respect to a q-ary convolutional code (code rate k/n) in which the length of the information block is k and the length of the encoded block is n:

$$\mu(y_t, w_t) = -\log \frac{P(y_t|w_t)}{P(y_t)} + k \log q \tag{1}$$

where $y_t$ and $w_t$ respectively denote a received block and encoded block (a branch in the trellis diagram) at time t. Also, $P(y_t)$ denotes a probability that the received block at time t is $y_t$. Further, $P(y_t|w_t)$ denotes a conditional probability that the received block at time t is $y_t$ when the encoded block at time t is $w_t$.

A metric between a received sequence $Y_L = y_0 y_1 y_2 \cdots y_{L-1}$ and an encoded sequence (path) $W_L = w_0 w_1 w_2 w_3 \cdots w_{L-1}$ is defined by the following equation:

$$\mu(y_L, w_L) = \sum_{i=0}^{L-1} \mu(y_t, w_t) \tag{2}$$

It is assumed that the communication channel is a memoryless, stationary channel. The metric thus defined above is called a Fano metric (sometimes, an expression obtained by multiplying equation (2) by −1 is defined as the Fano metric).

When an information sequence is random, in the normal convolutional code, all patterns of a length n appear in the code block at each time with an equal probability except for a few times in the commencement of encoding. Now, it is further assumed that the communication channel is a q-ary symmetric communication channel. In this case, all patterns of length n appear in each block of the received sequence except for a few times in the commencement. Thus, $P(y_t) = q^{-n}$. By substituting this into equation (1), the following is obtained:

$$\mu(y_t, w_t) = P(y_t|w_t) - (n-k) \log q \tag{3}$$

The first term of equation (3) is no more than the branch metric in the Viterbi decoding. Thus, the Fano metric is biased with $-(n-k)\log q$ which is not involved in the branch metric of the Viterbi decoding. The metric of the maximum likelihood does not increase even if it is longer, and does not have any disadvantage as compared to short paths.

A description will now be given of computation of the Fano metric in the sequential decoding by exemplarily describing a case where the sequential decoding is applied to a sequence estimation in mobile communications. A feature of mobile communications is that the radio propagation environment is a multipath propagation. When considering an up (transmission from a mobile station, reception in a base station) communication channel, a bundle of transmitted element waves which have been subject to scatter, diffraction and reflection around the mobile station arrives at the base station directly or after it is reflected at a great distance. Hence, the base station receives the transmitted signal in such a fashion that a plurality of components resulting from the transmitted signal have different incoming angles. These respective paths are subject to independent fading.

When a communication takes place in the mobile communication environment as described above, phenomena different from each other due to the bandwidths of the signals appear in the received signals. In a case where the transmitted signal has a low bit rate and the bandwidth thereof is much narrower than a coherence bandwidth in the channel, the differences in propagation delay time among the signals propagated through the above-mentioned paths are much smaller than the symbol time length (which is normally equal to the reciprocal number of the symbol rate) of the signals. In this case, the same information symbol is received on the reception side, and a waveform distortion due to intersymbol interference does not occur in the received signals.

When the bit rate of the transmitted signals increases and the bandwidth of the signals becomes approximately equal to the coherence bandwidth in the channel, information symbols different from each other in the respective paths are received. In this case, a waveform distortion due to intersymbol interference over a few past and future symbols occurs in the received signals. Since the paths are subject to the respective, independent fading as has been described above, the intersymbol interference over a few past and future symbols is a time-varying intersymbol interference in which the intersymbol interference varies with time.

Thus, an equalizer which eliminates the intersymbol interference is required to estimate a channel impulse response (which is equivalent to an arrangement in which the complex amplitudes of the paths are arranged in the order of arrival time) and to thus estimate the transmitted sequence. An algorithm based on the maximum likelihood sequence estimation theory (MLSE theory) can be applied to estimation of the transmitted sequence. When the intersymbol interference results from a few past and future symbols, the joint signal processing of channel estimation and MLSE can be achieved with reasonable complexity. This is described in detail in, for example, a literature: Fukawa, Suzuki, "Recursive Least Squares Adaptive Maximum Likelihood Sequence Estimation (RLS-MLSE)—An Application of Maximum Likelihood Estimation Theory to Mobile Radio", The Transaction of the Institute of Electronics, Information and Communication Engineers (B-11), J76-B-II, No. 4, PP. 202–214, April 1993.

As the transmission bit rate increases, the received signal is affected by an increased amount of intersymbol interference. Theoretically, the above-mentioned joint signal processing of the channel estimation and the MLSE can be applied to equalization of the intersymbol interference. However, the number of states in the Viterbi algorithm used in the MLSE increases exponentially with respect to the length of the intersymbol interference (equal to the channel memory length). For example, in a case where binary phase shift keying (BPSK) is used as a modulation method, if there is a channel memory length of 11 symbols, the number of states (involved in a 12-path channel) is 2048, which exceeds the practical complexity limit.

It will be seen from the above consideration, it can be said that technical drawbacks to be solved in order to achieve an adaptive equalizer in high-bit-rate channels on the megabit order are involved in the sequence estimation and channel estimation corresponding to the above sequence. Of the above drawbacks, an adaptive equalizer using a sequential sequence estimation instead of the maximum likelihood sequence estimation MLSE is proposed, as means for avoiding the difficulty in the sequence estimation, in a literature: Matumoto, "Sequential Sequence Estimation and Equalization in High Speed Mobile Communications", Proceedings of The 1997 Communications Society Conference of IEICE, B-5-149.

Sequential sequence estimation was originally developed as an algorithm for decoding convolutional codes having a long constraint length. More particularly, from a historical point of view, the sequential sequence estimation was directed to developing an application for deep space communication which applies to a constraint length as long as 40 to 60. The process in which the intersymbol interference occurs is no more than convolutional computation on a complex number field. Thus, it is apparent that sequential sequence estimation has affinity with adaptive equalization. The above document shows that a sequential sequence estimation is performed in 12 channels by using the BPSK, and the results of the above estimation show good performance can be obtained by reasonable complexity.

When sequential decoding is applied, as sequential sequence estimation, to mobile communications, the Fano metric can be computed by the following formula (see: F. Xiong, "Sequential Sequence Estimation for Channels with Intersymbol Interference of Finite or Infinite Length", IEEE Trans. Commun. vol.COM-38, No.6, PP.795–804, 1990):

$$P_0(z_k) = \frac{1}{M^L} \sum_{j=1}^{M^L} \frac{1}{\sqrt{2\pi}\,\sigma} \exp\left\{-\frac{(z_k - y_j)^2}{2\sigma^2}\right\} \quad (4)$$

$$P_n(z_k - y_k) = \frac{1}{\sqrt{2\pi}\,\sigma} \exp\left\{-\frac{(z_k - y_k)^2}{2\sigma^2}\right\} \quad (5)$$

$$\lambda(y_k, z_k) = \log\frac{P_n(z_k - y_k)}{P_0(z_k)} - \log M \quad (6)$$

where in equations (4), (5) and (6), M is a modulation multiplicity, L is the constraint number (the channel memory length), $\sigma^2$ is noise power, $z_k$ is the received sample value, $y_j$ is a replica of the received signal, and $\lambda(y_k,z_k)$ is the Fano metric.

According to equation (4), in $P_0(z_k)$ forming the Fano metric $\lambda(y_k,z_k)$, all of items of information (1 to $M_L$ for j) which may be transmitted with respect to the constraint length L are added.

Thus, the computational efforts of computation of equation (4) increases exponentially to a very large value as the value of L becomes greater. Thus, it takes a huge amount of time to achieve the computation process.

DISCLOSURE OF THE INVENTION

An object of the present invention is to reduce the computational efforts necessary for obtaining Fano metrics and reduce the time necessary for computation in a sequential decoder and a receiver equipped with such a decoder.

The present invention includes the following means as means for achieving the above object.

In the invention described in claim 1, a sequential decoder which performs decoding using Fano's likelihood values is characterized in that decoding is performed by referring to a history of a path and computing a likelihood value.

In the invention described in claim 2, the sequential decoder as claimed in claim 1 is characterized in that there is provided a transversal filter which generates a replica of a received signal, a history of a path related to a corresponding signal in modulation constellation applied to a given small tap coefficient of the transversal filter is referred to.

In the invention described in claim 3, the sequential decoder as claimed in claim 2 is characterized in that histories of some paths related to corresponding signals in modulation constellation applied to given small tap coefficients of the transversal filter are referred to in an increasing order of the tap coefficients of the transversal filter.

In the invention described in claim 4, the sequential decoder as claimed in claim 1 is characterized in that histories of consecutive paths which are paths within a constraint length and are the oldest in time are referred to.

In the invention described in claim 5, a sequential decoder which performs decoding using Fano's likelihood values is characterized in that there is provided a transversal filter which generates a predicted value of a received signal, a path related to a signal phase point signal applied to a given small tap coefficient of the transversal filter is ignored.

In the invention described in claim 6, the sequential decoder as claimed in any of claims 1 to 5 is characterized in that the decoder performs decoding using the Fano's likelihood values with respect to a signal of a channel which has a constraint length L (L is a natural number equal to or greater than 2) and a modulation multiple-valued number M, and performs the decoding by computing the likelihood values with regard to $M^{L-A}$ paths (A is an integer satisfying $0<A<L$).

In the invention described in claim 7, a receiver is equipped with the sequential decoder as claimed in any of claims 1 to 6.

According to the invention described in claims 1 to 6, it is possible to provide a sequential decoder capable of reducing the amount of computation for computing Fano metrics and reducing the time necessary for the computing process.

According to the invention described in claim 7, it is possible to provide a receiver equipped with a sequential decoder capable of reducing the amount of computation for computing Fano metrics and reducing the time necessary for the computing process.

BRIEF DESCRIPTION OF THE DRAWINGS

Other objects, features and advantages of the present invention will become more apparent from the following description read in conjunction with the accompanying drawings.

DESCRIPTION OF THE PREFERRED EMBODIMENTS

A description will be given of the present invention by referring to the accompanying drawings.

First Embodiment

According to equation (4) mentioned before, $P_0(z_k)$ forming the Fano metric $\lambda(y_k, z_k)$ includes a predicted value $y_j$ of the received signal. The above predicted value $y_j$ of the received signal can be obtained by the following equation:

$$y_j = \sum_{k=0}^{N-1} a_k X_{j,k} \tag{7}$$

Figure 1:
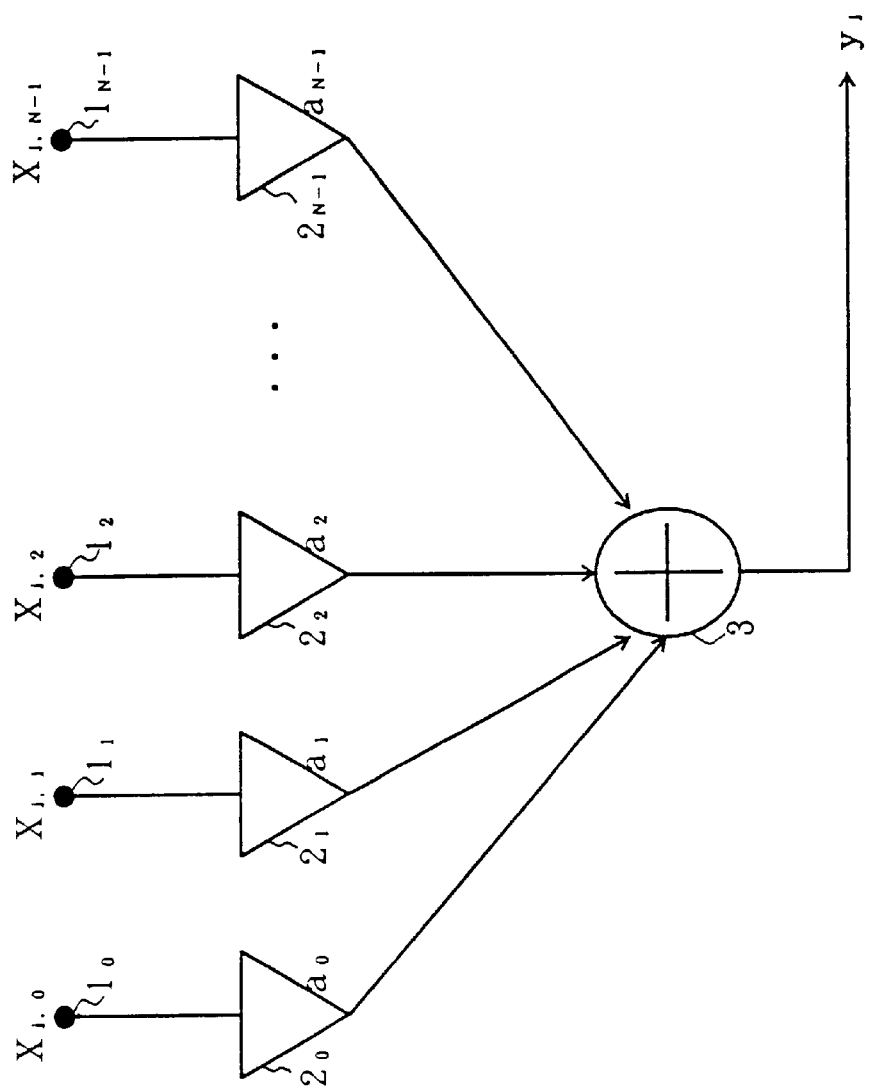
FIG. 1 is a diagram for explaining a circuit which outputs a predicted value of a received signal.

The predicted value $y_j$ of the received signal is obtained by a circuit shown in FIG. 1. Signal phase points $X_{j,0}$–$X_{j,N-1}$ created from the received signal are respectively applied to input terminals $1_0$–$1_{N-1}$. Tap coefficients $2_0$–$2_{N-1}$ (whose values are assumed as $a_0$–$a_{N-1}$) are determined so as to equalize the transmission characteristics by a parameter estimator 7 shown in FIG. 9, which will be described later. 3 indicates an adder circuit. Thus, the predicted value $y_j$ of the received signal can be expressed as the product of the tap coefficients $a_0$–$a_{N-1}$ of the equalizer and the signal phase points $X_{j,0}$–$X_{j,N-1}$ of the information sequence. The tap coefficients $a_0$–$a_{N-1}$ of the equalizer and the signal phase points $X_{j,0}$–$X_{j,N-1}$ are complex numbers. When the BPSK modulation is used, the signal phase points $X_{j,0}$–$X_{j,N-1}$ assume values of 1+i0,−1+i0 (where i denotes the imaginary unit).

In equation (4), all items of information which may be transmitted within the constraint length L are added. However, if the tap coefficient $a_k$ has a small value in equation (7), the signal phase point $X_{j,k}$ of the above information has little effect on the value of the predicted value $y_j$ of the received signal. Thus, it is possible to compute the likelihood value for decoding while ignoring or fixing the signal phase point $X_{j,k}$ applied to the tap having the given small tap coefficient. The present invention utilizes the above and thus reduces the amount of computation necessary for computing $P_0(z_k)$. The term "small" of the tap having the small tap coefficient means that the values of $a_k x_k$ can substantially be ignored regardless of the signal phase point $X_k$ in equation (7), and can be determined due to the channel nature, a necessary BER (Bit Error Rate) and so on. More particularly, there is a case where the tap coefficient $a_k$ is smaller than the other ones and a case where the absolute value is equal to or smaller than a certain numeral value (for example, the smallest tap coefficient or up to some tap coefficients from the smallest, or tap coefficients equal to or smaller than the average value by X% or those having values equal to or smaller than X).

Figure 2:
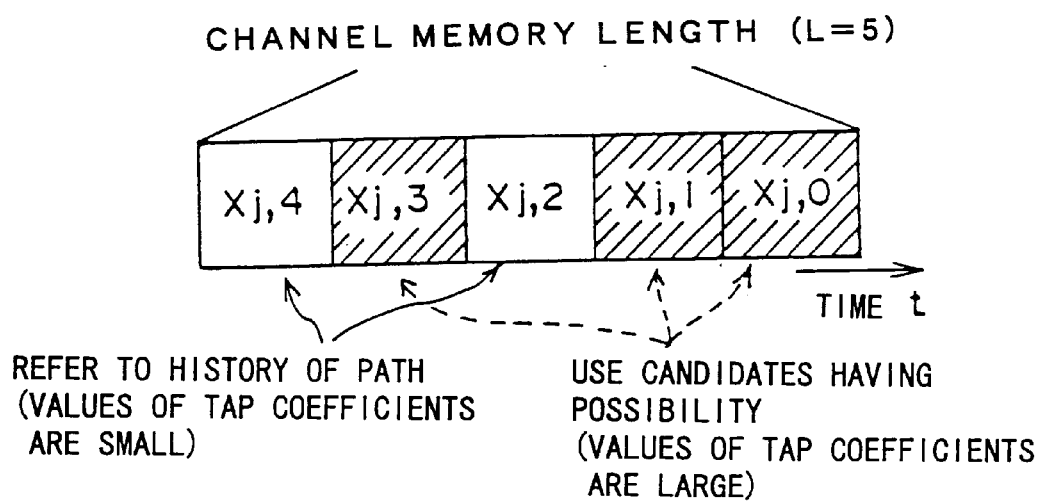
FIG. 2 is a diagram for explaining a part, in which a history of a path is referred to when Fano metrics are computed.
Figure 3:
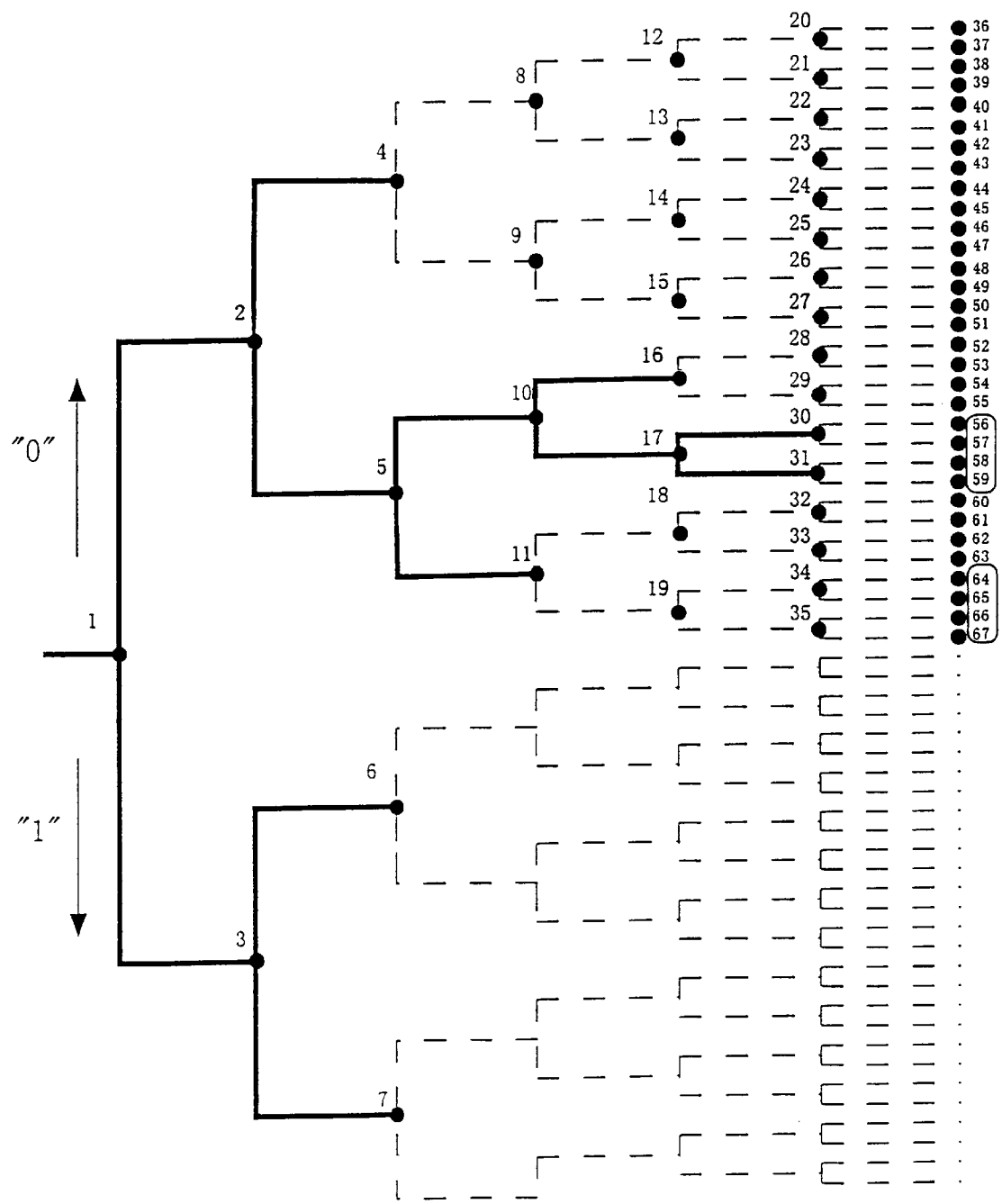
FIG. 3 is a diagram for explaining candidates of computation of Fano's likelihood values.

A description will be given, with reference to FIGS. 2 and 3, of signal phase points applied to the taps having the small tap coefficients and candidates in Fano metric computation. It is assumed that the input signal is a binary signal and the storage length in the channel consists of L (=5) symbols.

The current received signal is influenced by the past L−1 bits. The number of combinations of the past L bits are $2^L$. A consideration will be given assuming that the equalizer has L tap coefficients.

Figure 5:
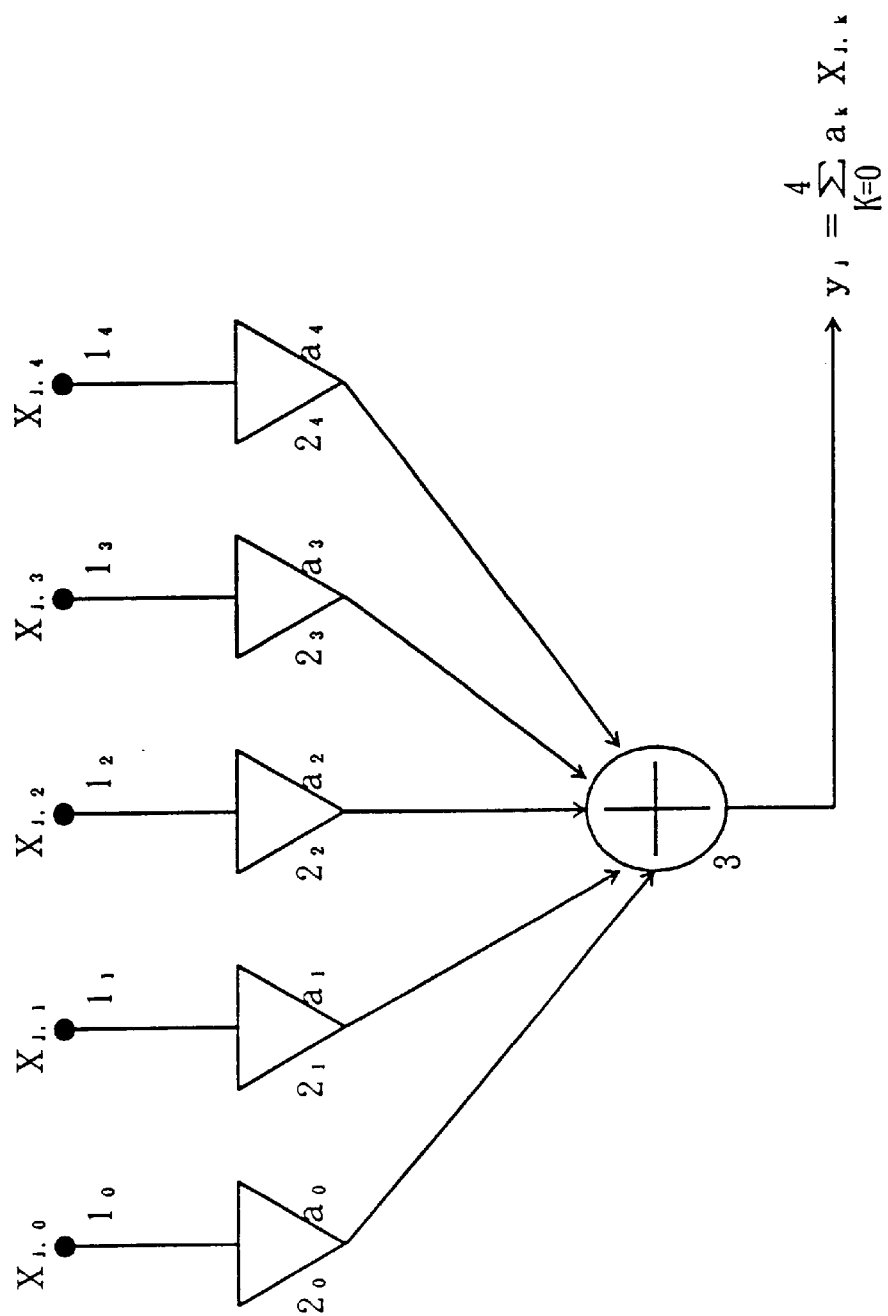
FIG. 5 is a diagram obtained when N=5 in FIG. 1.

The predicted value $y_i$ of the received signal is obtained by a circuit shown in FIG. 5. In this case, if the tap coefficients $a_4$ and $a_2$ are small, the products $a_4 X_{j,4}$ and $a_2 X_{j,2}$ of the signal phase point signals and the tap coefficients are small and are thus ignored. Alternatively, the signal phase points $X_{j,4}$ and $X_{j,2}$ are fixed by referring to the histories of the paths (for example, $X_{j,4}=1$, $X_{j,2}=1$).

A description will be given, with reference to FIG. 3, of the present invention in a case where the histories of paths are referred to with regard to two taps having small tap coefficient values (such a case which corresponds to a case for A=2 is described later) with the channel memory length equal to 5. In FIG. 3, upward paths denote paths in which an information symbol of 0 is considered, and downward paths denote paths in which an information symbol of 1 is considered. Also, in FIG. 3, solid cirles denote nodes. It is assumed that the sequential decoding progresses and a path consisting of nodes 1-2-5-10-17-30 is selected as the maximum likelihood path in a case where there are seven paths respectively consisting of nodes 1-2-4, 1-2-5-10-16, 1-2-5-10-17-30, 1-2-5-10-17-31, 1-2-5-11, 1-3-6 and 1-3-7. In order to compute the Fano metric of the selected path and thus expand the path by one time, conventionally, it is required to compute the Fano metrics of 5 paths by using all the paths (in total, 32 paths from a path of 2-4-8-12-20-36 to a path of 2-5-11-19-35-67). On the other hand, the present invention refers to the histories of paths having small tap coefficient values (the upward information symbol (1) or downward information symbol (0) of the selected path is referred to as it stands and is fixed).

In the case where the histories of paths are referred to with regard to two taps a2 and a4 having small tap coefficient values, the likelihoods are computed by using eight paths consisting of paths of nodes 2-5-10-17-31-56 to 2-5-10-17-31-59 and paths of nodes 2-5-11-19-34-64 to 2-5-11-19-34-67. As described above, the Fano metrics are computed except for some candidates for which reference to the histories of paths with respect to taps having small tap coefficient values is made rather than computing the Fano metric computation for all candidates based on the channel memory length.

As a result, it can be seen that, of all the candidates (32 paths), it is sufficient to perform computation on only eight paths that include nodes 56–59 and 64–67 enclosed with ○, and the computational efforts are ¼ and are thus reduced drastically.

Equation (4) can be modified in the following formation in the case where the tap coefficients which have small absolute values do not very much affect computation on the replica of the received signal, $y_j$ of the received signal and are thus ignored or the case where the signal phase point $X_{j,k}$ are fixed by referring to the histories of paths:

$$P_0(z_k) = \frac{1}{M^{L-A}} \sum_{j=1}^{M^{L-A}} \frac{1}{\sqrt{2\pi} \sigma} \exp\left\{-\frac{(z_k - y_j)^2}{2\sigma^2}\right\} \quad (8)$$

where A denotes the number of corresponding signal points in modulation constellation in which the tap coefficients are ignored or the histories of paths are referred to, and satisfies 0<A<L.

It can be seen that the computational efforts of computation of equation (8) are reduced to $1/M^A$ of that of equation (4).

By way of example, a description will now be given of a case where the constraint length L is equal to 3 and the modulation multiplicity M is equal to 2. Given the present invention is not used, the replica of the received signal, $y_j$ of the received signal are those of eight information symbol sequences {000,001,010,011,100,101,110,111} of the received signal. The value of $P_0(z_k)$ computed with regard to the received signal sample $z_k$ of, for example, a received information symbol sequence of 011 is the sum of the results obtained by the following expression (9) applied for the eight predicted values $y_j$ of the received signal:

$$\frac{1}{M^L} \frac{1}{\sqrt{2\pi} \sigma} \exp\left\{-\frac{(z_k - y_i)^2}{2\sigma^2}\right\} \quad (9)$$

Here, a description will be given of a method for reducing the computational efforts necessary for obtaining $P_0(z_k)$ by referring to the histories of the path with regard to an information symbol that is one symbol. First, the magnitudes of the absolute values of three taps are compared with each other. As an example, it is assumed that the absolute value of the oldest tap is the smallest. The information symbol of the received signal sample $z_k$ is now being considered, and the oldest information symbol is 0. In this case, with regard to the replica of the received signal, $y_j$ of the received signal, the oldest one of the information symbols sent in the past is fixed at 0. This is equivalent to a situation in which the histories of paths are referred to. There are four information symbol sequences {000, 001, 010, 011} of the replica of the received signal, $y_j$. By using the four $y_j$, $P_0(z_k)$ is computed. Thus, the computational efforts necessary for obtaining $P_0(z_k)$ are reduced to ½ of that obtained by the computation which does not refer to the histories of paths. This corresponds to a case where A=1 in equation (7). Similarly, when A is set equal to 2, the histories of paths with regard to the information symbol sequences on two taps having small tap coefficients are referred to. If the past values of the two tap coefficients are smaller than the current values thereof, two replicas of the received signal $y_j$, {010,011} are obtained. Hence, the computational efforts on equation (4) are reduced to ¼ of that obtained with A being equal to 0 (the histories of paths are not referred to).

Figure 4:
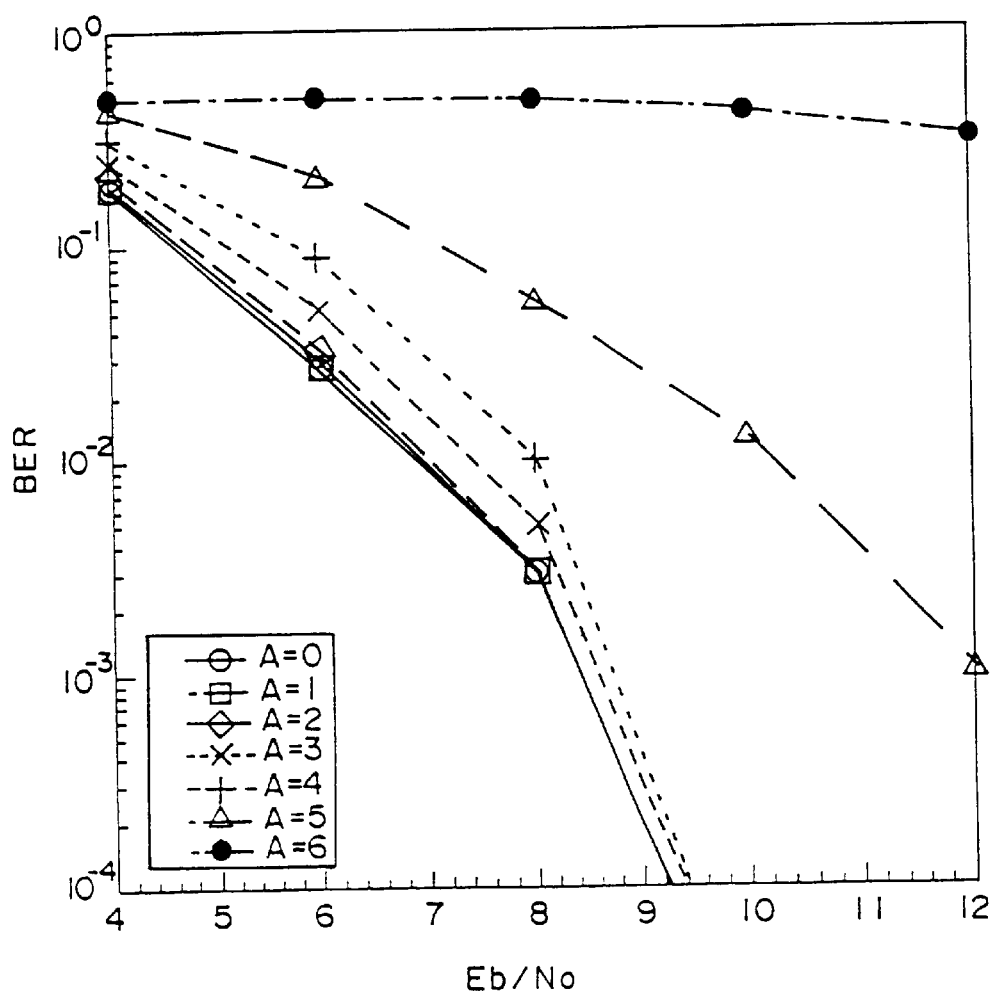
FIG. 4 is a diagram for explaining effects of a first embodiment of the present invention.

As described above, according to the present invention, it is possible to reduce the computational efforts on the likelihoods in the sequential decoding. As an example, FIG. 4 shows error rate performances obtained by computer simulations performed under the condition that a Jelinek Zigangirov algorithm (literature: F. Jelinek, "Fast Sequential Decoding Algorithm Using a Stack", IBM J. Develop., Vo.13, No.6, pp. 675–685, November 1969) is used as a sequential sequence estimation algorithm and an LMS (Lease Mean Squares) algorithm is used as a channel estimation algorithm.

In FIG. 4, the vertical axis denotes the average bit error rate (BER) and the horizontal axis denotes Eb/No (the bit energy-to-noise ratio). The modulation is performed using the BPSK, and the information transmission rate is 12 Mbps. Also, the maximum Doppler frequency indicating the speed of fading fluctuations is 1000 Hz. The frame is constructed so that the first 128 symbols are unique words, which are known signals (training signals), for an estimation of channel impulse response, and 1024 symbols follow as information symbols. A channel is a 7-path Rayleigh fading channel of equal levels. On the reception side, a 7-tap equalizer is used to perform the sequential sequence estimation, and a two-branch diversity is employed (as to diversity using two antennas and computation on the likelihood with the two-branch diversity, see a literature: E. Katz, "Sequential Sequence Estimation for Trellis-Coded Modulation on Multipath Fading ISI Channels", IEEE, Trans. Commun., vol. COM-43, No. 12, PP. 2882–2885, 1995).

The value of A in FIG. 4 corresponds to the value of A in equation (8). Thus, for A=0, $P_0(z_k)$ is computed using all candidates of the past information as in the conventional case. For A=1, the computation is carried out by referring to the history of the path with regard to one symbol of information having the smallest tap coefficient associated therewith. Similarly, for A=6, the computation is performed by referring to the histories of paths with regard to six symbols of information having the small tap coefficients associated therewith. From FIG. 4, the BER performances for A=1, 2 degrade greatly for A=5, 6, while the BER performances are almost the same as that for A=0. By setting A equal to 2, the computational efforts necessary for obtaining $P_0(z_k)$ are reduced to ¼ of those that for A=0. Also, for A=3 or larger, the performances degrade gradually, while the computational efforts reduce. That is, it is possible to design a trade-off between the performance and the computational efforts.

As described above, according to the present invention, it is possible to reduce the computational efforts necessary for obtaining $P_0(z_k)$, that is, the computational efforts necessary for obtaining the Fano metrics. In the above description, it is possible to reduce the computational efforts to ¼ without degradation of the BER performances under the condition of the computer simulations. However, the computational efforts which can be reduced depend on the condition for the sequential sequence estimation. Thus, there is a case where the computational efforts can be further greatly reduced.

Also, in the above description, the tap coefficients are compared at each time of symbol. However, it is not required to compare the tap coefficients at each time in cases where the propagation path fluctuates gently. Even if the comparison is performed at constant intervals, the performance will not be degraded. As a result of the constant-interval computation, it is possible to further reduce the computational efforts.

Although reduction of the computational efforts used for the sequential sequence estimation in mobile communications has been described, the same effects will be obtained in other fields by using the sequential sequence estimation.

Also, in the above description, the Jelinek Zigangirov algorithm is used as the algorithm for sequential decoding. However, even when an algorithm other than the above is used, the same effects will be obtained in the case where the Fano metrics are computed using sequential decoding.

According to the present embodiment, it is possible to reduce the computational efforts for obtaining the Fano metrics and the time necessary for the computation in the sequential decoder which performs decoding using the Fano's likelihood values.

Second Embodiment

A description will now be given of a second embodiment with reference to the accompanying drawings. The present invention is directed to taking into consideration a factor of time and omitting a part of the computation defined by equation (4) on the basis of past information.

That is, as has been described previously, in equation (4), all items of information which may be transmitted with respect to the constraint length L are added. In contrast, the second embodiment refers to the histories of a few consecutive paths which are within the constraint length and are the oldest in time, and thus reduces the computational efforts. That is, a few consecutive oldest paths are fixed and excluded from the computation.

Figure 6:
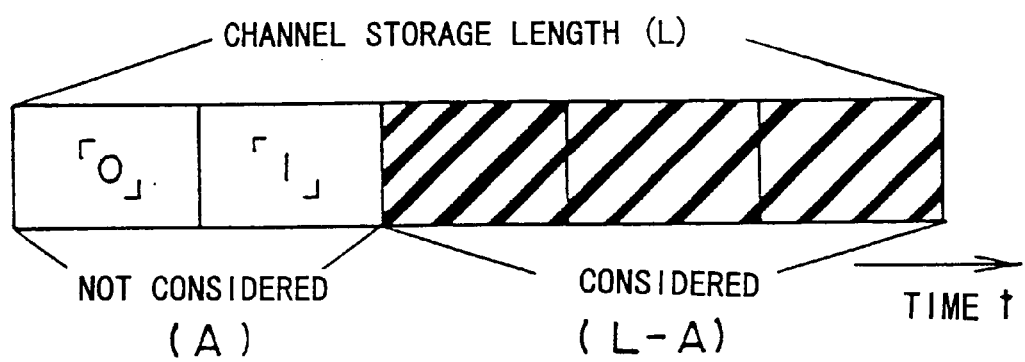
FIG. 6 is a diagram for explaining a part in which a storage length in channel and a computation process are considered.

Referring to FIG. 6, as to a path related to A in which estimation has been performed and some time elapses, values "0" and "1" as estimated are used as they are, and the likelihood values are not computed. The likelihood values are computed with regard to a part L-A close to the decision time. A further description will be given, with reference to FIG. 7, of the present invention applied to a case where the channel memory length L is equal to 5 and the histories of the two paths estimated in the past are referred to (a case where A=2).

Figure 7:
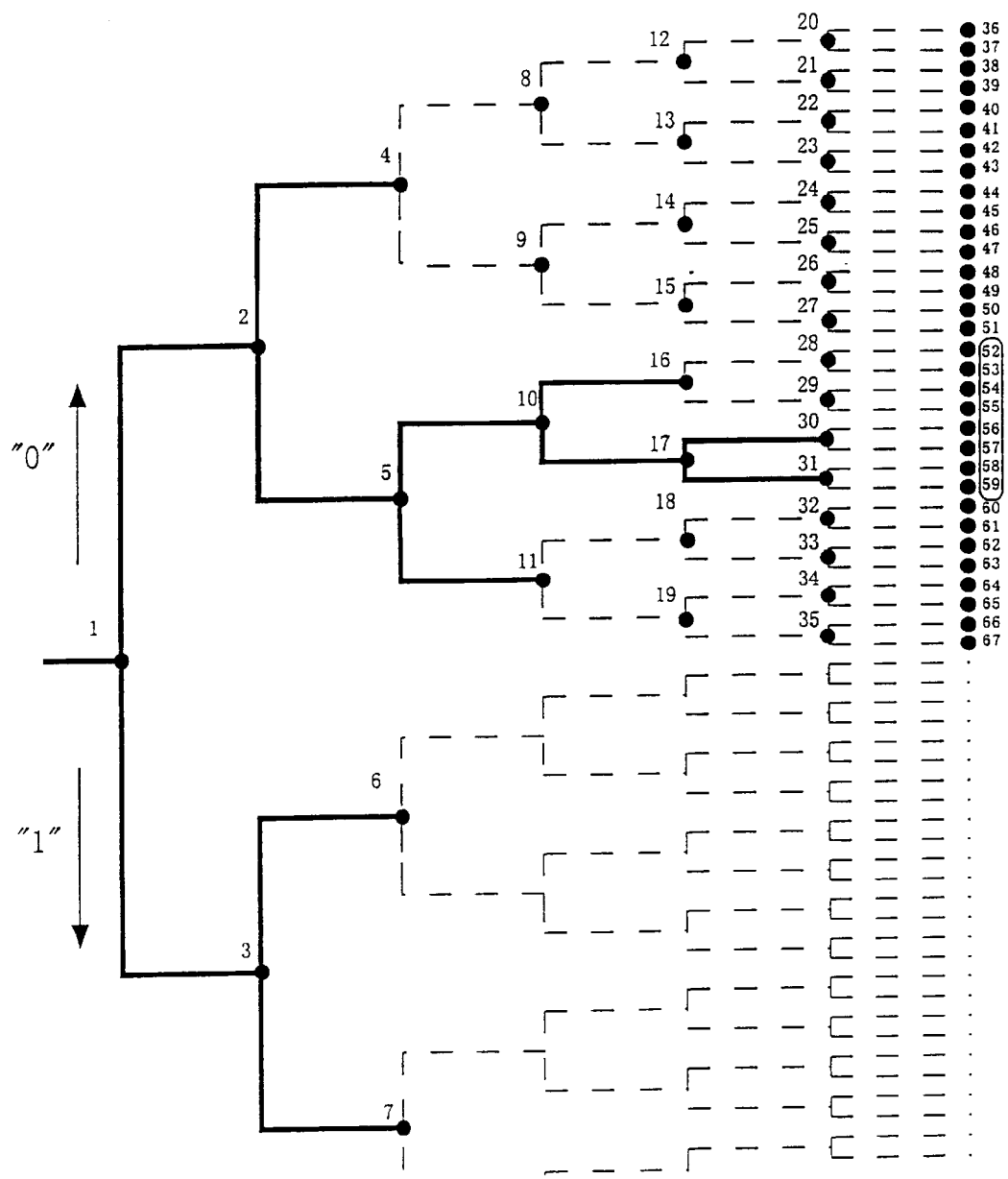
FIG. 7 is a diagram for explaining candidates of calculation of Fano's likelihood values.

In FIG. 7, the upward paths are those which consider an information symbol of 0, and the downward paths are those which consider an information symbol of 1. Also, in FIG. 7, solid circles denote nodes. It is assumed that the sequential decoding progresses and a path consisting of nodes 1-2-5-10-17-30 is selected as the maximum likelihood path in a case where there are seven paths respectively consisting of nodes 1-2-4, 1-2-5-10-16, 1-2-5-10-17-30, 1-2-5-10-17-31, 1-2-5-11, 1-3-6 and 1-3-7. In order to compute the Fano metric of the selected path and thus expand the path by one time, conventionally, it is required to compute the Fano metrics of 5 paths by using all the paths (in total, 32 paths from a path of 2-4-8-12-20-36 to a path of 2-5-11-19-35-67). On the other hand, the present invention refers to the past histories with respect to the paths which have been estimated.

Since A=2 in the case being considered, the likelihood is computed by using eight paths consisting of paths of nodes 2-5-10-16-28-52 to 2-5-10-17-31-59. As described above, the Fano metrics are computed except for some candidates by referring to the histories with respect to the past paths rather than the Fano metric computation using all candidates based on the channel storage length.

As a result, it can be seen that, of all the candidates (32 paths), it is enough to perform computation on only eight paths that includes nodes 52–59 enclosed with ○, and the computational efforts are ¼ and are thus reduced drastically.

In FIGS. 6 and 7, information concerning two past old points is fixed and a computation thereof is omitted. In this case, a decision on up to which point from the past should be fixed is made taking into account the properties of signals and so on.

The reason why no problem is encountered even by referring to the histories of paths with regard to the past information and fixing the information is that the older symbols among the symbols represented by the surviving paths are still surviving even after path selection, so that there is only a little influence even when the past symbols are more likely and are thus fixed.

Equation (4) can be modified in the following fashion in the case where the histories of paths are referred to with regard to the past information:

$$P_0(z_k) = \frac{1}{M^{L-A}} \sum_{j=1}^{M^{L-A}} \frac{1}{\sqrt{2\pi}\,\sigma} \exp\left\{-\frac{(z_k - y_j)^2}{2\sigma^2}\right\} \quad (10)$$

where A denotes an integer that satisfies 0<A<L and is a numeral in which the histories of paths are referred to.

By using equation (7) instead of equation (4), the computational efforts are reduced to $1/M^A$ of those of equation (4).

By way of example, a description will now be given of a case where the constraint length L is equal to 3 and the modulation multiplicity M is equal to 2. Given the present invention is not used, the replica of the received signal, $y_j$ is that of eight information symbol sequences {000,001,010, 011,100,101,110,111} of the received signal. The value of $P_0(z_k)$ computed with regard to the received signal sample $z_k$ of, for example, a received information symbol sequence of 011 is the sum of the results obtained by equation (8) applied for the eight predicted values $y_j$ of the received signal:

$$\frac{1}{M^{L-A}} \frac{1}{\sqrt{2\pi}\,\sigma} \exp\left\{-\frac{(z_k - y_j)^2}{2\sigma^2}\right\} \quad (11)$$

Here, a description will be given of a method for reducing the computational efforts necessary for obtaining $P_0(z_k)$ by referring to the histories of paths with regard to an information symbol that is one symbol.

It can be seen from an information symbol sequence 011 of $z_k$ that the oldest information is 0. Hence, the oldest information symbol in the predicted value $y_j$ is fixed to 0. Thus, there are four information symbol sequences {000, 001,010,011} of $y_j$. By using the four $y_j$, $P_0(z_k)$ is computed. Thus, the computational efforts necessary for obtaining $P_0(z_k)$ are reduced to ½ of those obtained by the computation which does not refer to the histories of paths. This corresponds to a case where A=1 in equation (7). Similarly, when A is set equal to 2, the histories of the paths with regard to the two past information symbol sequences are referred to. In this case, two information sequences {010,011} of $y_j$ are obtained. Hence, the computational efforts of equation (4) is reduced to ¼ of that obtained with A being equal to 0 (the histories of paths are not referred to).

Figure 8:
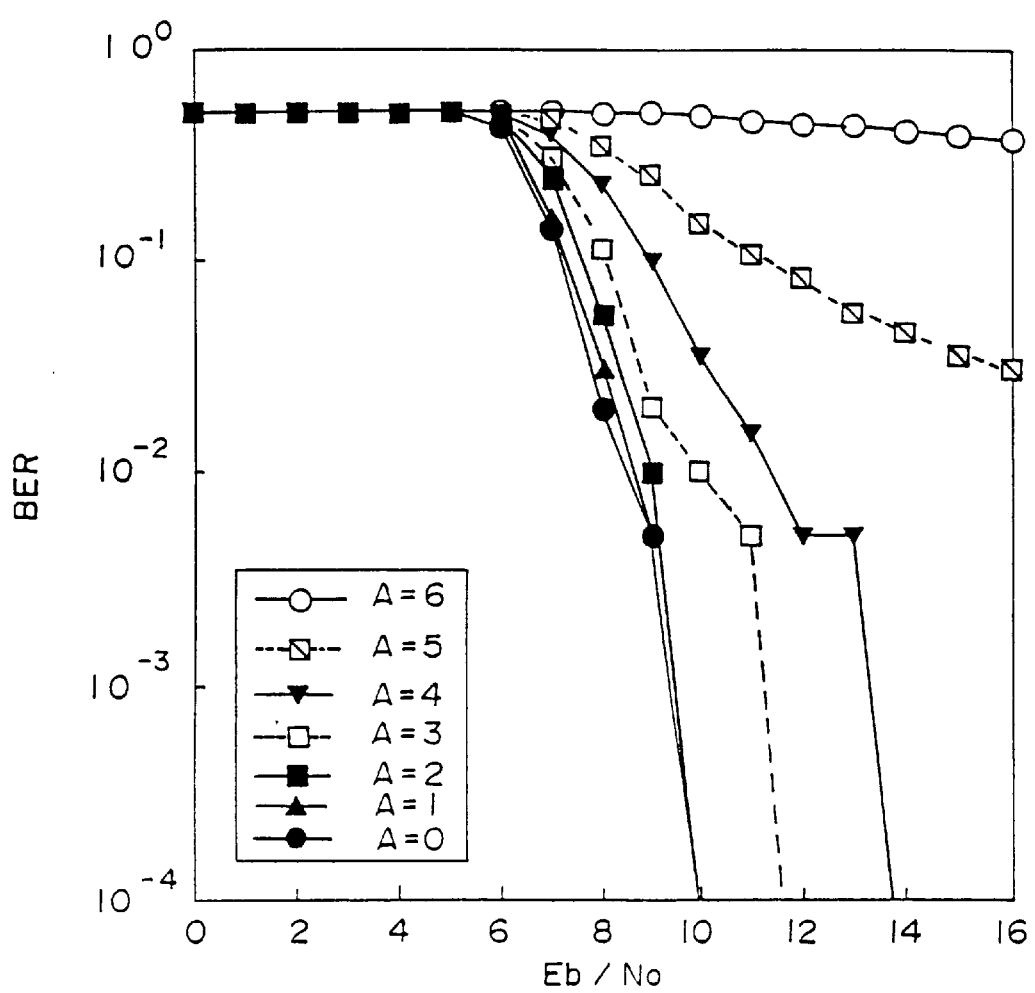
FIG. 8 is a diagram for explaining a second embodiment of the present invention.

As described above, according to the present invention, it is possible to reduce the computational efforts on the likelihoods in the sequential decoding. As an example, FIG. 8 shows bit error rate performances obtained by computer simulations performed under the condition that the Jelinek Zigangirov algorithm (literature: F. Jelinek, "Fast Sequential Decoding Algorithm Using a Stack", IBM J. Develop., Vo.13, No.6, pp. 675–685, November 1969) is used as a sequential sequence estimation algorithm and an LMS (Lease Mean Squares) algorithm is used as a channel estimation algorithm.

In FIG. 8, the vertical axis denotes the average bit error rate (BER) and the horizontal axis denotes Eb/No (the bit energy-to-noise ratio). The modulation is performed using the BPSK, and the information transmission rate is 12 Mbps. Also, the maximum Doppler frequency indicating the speed of fading fluctuations is 1000 Hz. The frame is constructed so that the first 128 symbols are unique words which are known signals (training signals), for an estimation of channel impulse response, and 1024 symbols follow as information symbols. A channel is a 7-path Rayleigh fading channel of equal levels. On the reception side, a 7-tap equalizer is used to perform the sequential sequence estimation, and a two-branch diversity is employed (as to a diversity using two antennas and computation on the likelihood with the two-branch diversity, see a literature: E. Katz, "Sequential Sequence Estimation for Trellis-Coded Modulation on Multipath Fading ISI Channels", IEEE, Trans. Commun., vol. COM-43, No. 12, PP. 2882–2885, 1995).

The value of A in FIG. 8 corresponds to the value of A in equation (7). Thus, for A=0, $P_0(z_k)$ is computed using all candidates of the past information as in the conventional case. For A=1, the computation is carried out by referring to the history of the path with regard to one symbol of information. Similarly, for A=6, the computation is performed by referring to the histories of the paths with regard to six symbols of information. By setting A equal to 2, the computational efforts necessary for obtaining $P_0(z_k)$ is reduced to ¼ of that for A=0. Also, for A=3 or larger, the performances degrade gradually, while the computational efforts reduce. That is, it is possible to design a trade-off between the performance and the computational efforts.

The computational efforts which can be reduced depend on the condition for the sequential sequence estimation. Thus, there is a case where the computational efforts can be further greatly reduced.

Although reduction of the computational efforts used for the sequential sequence estimation in mobile communications has been described, the same effects will be obtained in other fields by using the sequential sequence estimation.

Also, in the above description, the Jelinek Zigangirov algorithm is used as the algorithm for sequential decoding. However, even when an algorithm other than the above is used, the same effects will be obtained in the case where the Fano metrics are computed using sequential decoding. According to the present embodiment, it is possible to reduce the computational efforts for obtaining the Fano metrics and the time necessary for the computation in the sequential decoder which performs decoding using the Fano's likelihood values.

Third Embodiment

Figure 9:
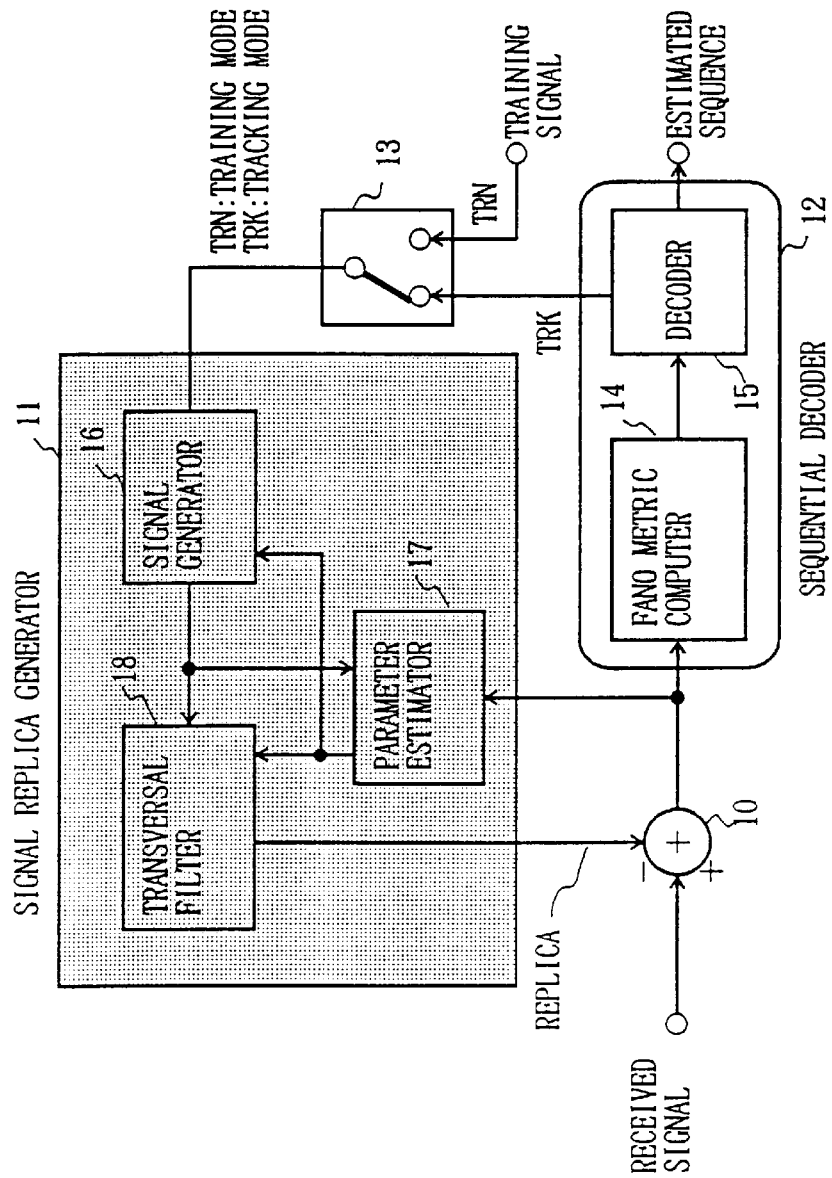
FIG. 9 is a diagram for explaining a third embodiment of the present invention (an example of a receiver).

Next, a description will be given, with reference to FIG. 9, of a receiver configured by applying the first and second embodiments to mobile communications.

The receiver includes an adder 10, a sequential decoder 12, a switch 13 and a signal replica generator 11. The switch 13 applies a training signal created in the receiver to the signal replica generator 11 at the time of a training mode, and applies an output of the sequential decoder 12 to the signal replica generator 11 at the time of a tracking mode.

The sequential decoder 12 is made up of a Fano metric computer 14 and a decoder 15. The Fano metric computer 14 computes the Fano metrics, and the values thereof are passed to the decoder 15, which performs decoding (sequence estimation).

The signal replica generator 11 is made up of a signal generator 16, a parameter estimator 17, and a transversal filter 18.

At the time of decoding, a known signal (training signal) is first sent from the transmission side. At that time, the switch 13 of the reception side switches to the training mode, and the same training signal as that on the transmission side is applied to the signal replica generator 11. The information sequence of the training signal in the training mode enters the signal generator 16, and is mapped to a sequence of corresponding signal points in modulation constellation. Using the above values, the transversal filter 18 produces replicas of the received signal. The parameter estimator 17 performs a channel estimation using a residual signal between the replicas of the received signal and the received signal. The channel estimation is performed for every symbol, and the estimated values of the channel state are set, as the tap coefficients, to the respective taps of the transversal filter 18.

When the channel estimation in the training mode is finished, the tracking mode is enabled. In the tracking mode, the channel estimation is performed while the process of decoding (sequence estimation) progresses. Thus, the values of the tap coefficients are updated so as to follow fluctuations of the channel. A description will now be given of a method of using, as the state of the channel used for generating the replica of the received signal, the one-time-preceding state which is one time earlier than the time at which the decoding is performed. This is based on an idea such that the state of the channel obtained at the time of performing the process of decoding (sequence estimation) is approximately equivalent to that obtained one time earlier (however, there is also a method in which the channel state rather than that obtained one time earlier is initially updated, and the Fano metrics are computed after the channel state at the current time is estimated).

In the case of computing the Fano metrics, conventionally, it is required to use all the candidates of the replica of the received signal determined by the channel memory length. The signal generator 16 generates all the candidates and passes these signals to the transversal filter 18. Thus, all the candidates of the replica of the received signal are calculated and the Fano metrics are computed. Thereafter, the path metrics are computed by using the Fano metrics and the nodes are expanded by one time. Using the results of the above, the process of estimating the channel state is performed. That is, the results of decoding (the results of the sequence estimation) are passed from the decoder 15 to the signal generator 16 so that a sequence of corresponding signal points in modulation constellation is obtained. The value of the sequence is input to the transversal filter 18, which produces a replica of the received signal. The parameter estimator 17 estimates the channel state by using the difference between the replica of the received signal and the received signal. The above process progresses, and the result finally obtained becomes an estimated sequence.

In the present invention, in the case where the past histories are referred to with regard to an information symbol sequence having a small tap, as shown as "1", the value of the tap coefficient is passed to the signal generator 16 from the parameter estimator 17. That is, the signal generator 16, which generates all the candidates of the replica of the received signal in the conventional fashion, uses the histories of paths passed from the decoder 15 and the values of the tap coefficients (the values of the channel state) passed from the parameter estimator 17 and generates candidates of the replica of the received signal by referring to the histories of paths with regard to the tap coefficients having small values. It is thus possible to reduce the number of candidates of the replica of the received signal because histories of paths with regard to the tap coefficients having small tap coefficients are referred to and the values of the tap coefficients are fixed.

Next, as to the past sequences, when the histories of paths are referred to so that the results of estimation are deemed likely, the arrows of "1" in the figure are not needed. By using the histories of paths passed from the decoder 15, the signal generator 16 generates the candidates of the replica of the received signal. That is, the signal generator 16 refers to the histories of paths with regard to the past sequences and fixes the values thereof, so that the number of candidates of the replica of the received signal can be reduced. As described above, the histories of paths are passed to the signal generator 16 from the decoder 15.

The present invention is not limited to the specifically disclosed embodiments, and various variations and embodiments may be made without departing from the scope of the present invention.

What is claimed is:

1. A sequential decoder which performs decoding using Fano's likelihood values, comprising:
    a Fano metric computer configured to decode by computing a Fano's likelihood value on a number of candidates of a replica of a received signal which are reduced using a history of a path,
    wherein the replica of the received signal is generated by a transversal filter, and
    wherein the history of the path that is used for reducing the number of the candidates corresponds to a corresponding signal in modulation constellation applied to a given small tap coefficient of the transversal filter.

2. The sequential decoder as claimed in claim 1,
    wherein histories of some paths are used for reducing the number of the candidates of the replica, the histories of the some paths correspond to corresponding signals in modulation constellation applied to given small tap coefficients of the transversal filter, and each of the given small tap coefficients is equal to or smaller than a predetermined value.

3. The sequential decoder as claimed in claim 1,
    wherein histories of consecutive paths are used for reducing the number of the candidates of the replica, and the consecutive paths are paths within a constraint length and include an oldest path.

4. A sequential decoder which performs decoding using Fano's likelihood values, comprising:
    a Fano metric computer configured to decode by computing a Fano's likelihood value on a number of candidates of a replica of a received signal which are reduced by ignoring a path,
    wherein the replica of a received signal is generated by a transversal filter, and the path that is ignored corresponds to a corresponding signal in modulation constellation applied to a given small tap coefficient of the transversal filter.

5. A sequential decoder which performs decoding using Fano's likelihood values, comprising:
    a Fano metric computer configured to decode by computing a Fano's likelihood value on a number of candidates of a replica of a received signal which are reduced using a history of a path,
    wherein the decoder performs decoding using the Fano's likelihood values with respect to a signal of a channel which has a constraint length L (L is a natural number equal to or greater than 2) and a modulation multiplicity M, and performs the decoding by computing the likelihood values with regard to $M^{L-A}$ paths (A is an integer satisfying 0<A<L).

6. A receiver comprising a sequential decoder which performs decoding using Fano's likelihood values, comprising:
    a signal replica generator configured to generate a number of candidates of a replica of a received signal which are reduced by using a history of a path;
    a sequential decoder configured to decode by computing a Fano's likelihood value using the reduced candidates;
    an adder; and
    a switch configured to switch between an output of the sequential decoder and a training signal,
    wherein the signal replica generator includes a signal generator which maps a "0", "1" signal sequence from the switch which selects either the output of the sequential decoder or the training signal to a signal of corresponding signal points in modulation constellation, a transversal filter forming an equalizer, and a parameter estimator estimating tap coefficients of the transversal filter, and
    wherein the transversal filter, to which the tap coefficients are set by an output of the parameter estimator, equalizes the output of the signal generator and generates a signal replica.

7. The sequential decoder as claimed in claim 4,
    wherein the decoder performs decoding using the Fano's likelihood values with respect to a signal of a channel which has a constraint length L (L is a natural number equal to or greater than 2) and a modulation multiplicity M, and performs the decoding by computing the likelihood values with regard to $M^{L-A}$ paths (A is an integer satisfying 0<A<L).

8. A receiver comprising a sequential decoder which performs decoding using Fano's likelihood values, comprising:
    a signal replica generator configured to generate a number of candidates of a replica of a received signal which are reduced by ignoring a path; and
    a sequential decoder configured to decode by computing a Fano's likelihood value using the reduced candidates,
    wherein the signal replica generator includes a transversal filter configured to generate the replica of the received signal, and the path that is ignored corresponds to a corresponding signal in modulation constellation applied to a given small tap coefficient of the transversal filter.

9. The receiver as claimed in claim 8, further comprising:
    an adder; and
    a switch configured to switch between an output of the sequential decoder and a training signal,
    wherein the signal replica generator includes a signal generator which maps a "0", "1" signal sequence from the switch which selects either the output of the sequential decoder or the training signal to a signal of corresponding signal points in modulation constellation, a transversal filter forming an equalizer, and a parameter estimator estimating tap coefficients of the transversal filter, and
    wherein the transversal filter, to which the tap coefficients are set by an output of the parameter estimator, equalizes the output of the signal generator and generates a signal replica.

* * * * *